United States Patent
Chen et al.

(10) Patent No.: US 6,383,930 B1
(45) Date of Patent: May 7, 2002

(54) METHOD TO ELIMINATE COPPER CMP RESIDUE OF AN ALIGNMENT MARK FOR DAMASCENE PROCESSES

(75) Inventors: Ying-Ho Chen, Taipei; Wen-Chih Chiou, Miaoli; Tsu Shih; Syun-Ming Jang, both of Hsin-Chu, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/902,896

(22) Filed: Jul. 12, 2001

(51) Int. Cl.[7] ............... H01K 21/44; H01K 21/76
(52) U.S. Cl. ............... 438/687; 438/401; 438/462; 438/633; 438/692
(58) Field of Search ............... 438/687, 401, 438/462, 631, 633, 691–692, 975

(56) References Cited

U.S. PATENT DOCUMENTS

| | | | |
|---|---|---|---|
| 5,470,791 A | * 11/1995 | Suguro et al. | 438/301 |
| 5,665,655 A | * 9/1997 | White | 438/462 |
| 5,874,778 A | * 2/1999 | Bhattacharyya et al. | 257/758 |
| 6,037,671 A | 3/2000 | Kepler et al. | 257/797 |
| 6,087,733 A | 7/2000 | Maxim et al. | 257/797 |
| 6,093,640 A | 7/2000 | Hsu et al. | 438/631 |
| 6,100,158 A | 8/2000 | Lee et al. | 438/401 |
| 6,114,215 A | 9/2000 | Osugj et al. | 438/401 |
| 6,143,622 A | * 11/2000 | Yamamoto et al. | 257/797 |
| 6,180,503 B1 | * 1/2001 | Tzeng et al. | 257/529 |
| 6,248,659 B1 | * 6/2001 | Liang et al. | 438/618 |

FOREIGN PATENT DOCUMENTS

JP          408046043 A   *  2/1996   ......... H01L/21/768

* cited by examiner

*Primary Examiner*—Charles Bowers
*Assistant Examiner*—Thanh Nguyen
(74) *Attorney, Agent, or Firm*—George O. Saile; Stephen B. Ackerman

(57) ABSTRACT

A new method is provided that affects the polishing rate of the surface of a layer of copper, that has been deposited over the surface of a layer of dielectric. Copper damascene structures have been created in the surface of the layer of dielectric, the layer of dielectric also overlies an alignment mark. The surface of the layer of dielectric that is aligned with the alignment mark is provided with dummy damascene structures, assuring equal polishing rates for active damascene structures and the surface region of the layer of dielectric overlying an alignment mark.

18 Claims, 2 Drawing Sheets

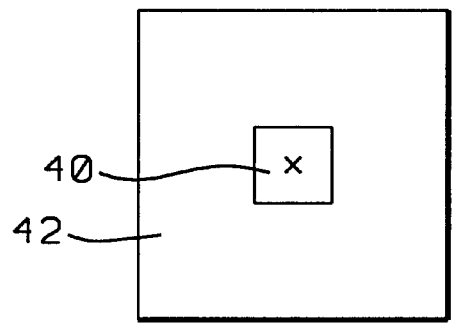
*FIG. 1 - Prior Art*
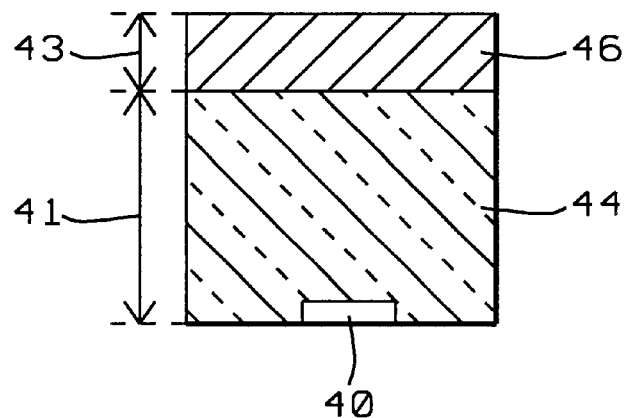
*FIG. 2 - Prior Art*

METHOD TO ELIMINATE COPPER CMP RESIDUE OF AN ALIGNMENT MARK FOR DAMASCENE PROCESSES

BACKGROUND OF THE INVENTION (1) Field of the Invention

The invention relates to the fabrication of integrated circuit devices, and more particularly, to a method for the elimination of copper residue that remains on the surface overlying a wafer alignment mark after copper Chemical Mechanical Polishing of the surface.

(2) Description of the Prior Art

The creation of semiconductor devices in or on the surface of a semiconductor substrate makes extensive use of methods of photolithography for the exposure and patterning of various layers of these devices. The photolithographic process makes use of repeated steps of replicating a required pattern into a semiconductor surface, which in many applications is the surface of a semiconductor substrate. With the continuing increase in device density and device miniaturization, more and more masks are used for the creation of the devices, imposing ever more stringent requirements of accurately aligning the successive masks with respect to each other in order to create well aligned exposures in the layers of photoresist that are used to create the design patterns. Misalignment between layers of photoresist that are used to create device features has a severe negative impact on device yield and must therefore be avoided in a most rigorous manner. The substrate, in or on the surface of which semiconductor devices are created, is first positioned in an exposure tool (the wafer stepper) by using a V-shaped notch in the circumference of the substrate. The wafer is next provided with alignment marks on the surface thereof that are used to align successive exposures that are performed to layers of photoresist that are deposited over the surface of the substrate. The exposure masks that contain the image of the pattern that is to be created on the exposed layer of photoresist that has been deposited over the surface of the substrate also contain alignment marks. By providing exact alignment between the marks provided on the surface of the substrate and the marks provided in the exposure masks, correct alignment between the layers of photoresist that are used for the creation of the semiconductor device can be assured. This alignment is assured by shining a light through the alignment mark of the exposure mask, this light strikes the alignment mark that is on the surface of the substrate from which the light is reflected. The reflected light is intercepted and analyzed by an alignment sensor from which exact alignment between the mark of the exposure mask and the mark of the substrate can be determined.

Current processes make frequent use of copper as an interconnect metal in view of the desirable characteristics of copper such as relatively low cost, ease of processing, stress voiding resistance, low resistivity and resistance against electromigration. In addition, copper finds frequent application as the metal of choice in creating damascene and dual damascene interconnects. The damascene process is being applied for a number of applications, the most commonly applied process being first metal or local interconnects. Where copper provides a challenge is in copper's high susceptibility to oxidation, conventional photoresist processing cannot be used when copper is to be patterned into various wire shapes because the photoresist needs to be removed at the end of the process by heating it in a highly oxidized environment, resulting in oxidation of the exposed copper surfaces. Copper also suffers from high diffusivity in common insulating materials such as silicon oxide and Oxygen-containing polymers. For instance, copper tends to diffuse into polyimide during high temperature processing of the polyimide. This causes severe corrosion of the copper and the polyimide due to the copper combining with oxygen in the polyimide. The corrosion may result in loss of adhesion, delamination, voids, and ultimately a catastrophic failure of the component. A copper diffusion barrier is therefore often required.

The present invention addresses the creation of copper damascene patterns in the surface of a layer of dielectric that overlies an alignment mark. Copper damascene residue that typically remains in place over the surface of the layer of dielectric that overlies the alignment mark is removed by the invention.

U.S. Pat. No. 6,100,158 (Lee et al.) discloses a method for forming a metal layer over an alignment mark.

U.S. Pat. No. 6,087,733 (Maxim et al.), U.S. Pat. No. 6,037,671 (Kepler et al.), U.S. Pat. No. 6,114,215 (Osugi et al.) and U.S. Pat. No. 6,093,640 (Hsu et al.) show related patents, which show alignment marks and metal layers.

SUMMARY OF THE INVENTION

A principle objective of the invention is to provide a method of removing copper residue from the surface of a layer of dielectric overlying an alignment mark on a semiconductor surface, copper damascene structures having been created in the surface of the layer of dielectric.

Yet another objective of the invention is to equalize the removal rate of a deposited layer of copper from the surface of a layer of dielectric, including the surface region of the layer of dielectric overlying alignment mark and the surface region of the layer of dielectric in which damascene structures are being formed.

A still further objective of the invention is to eliminate copper residue, created during the formation of copper damascene structures, as a source of device failure.

In accordance with the objectives of the invention a new method is provided that affects the polishing rate of the surface of a layer of copper, that has been deposited over the surface of a layer of dielectric. Copper damascene structures have been created in the surface of the layer of dielectric, the layer of dielectric also overlies an alignment mark. The surface of the layer of dielectric that is aligned with the alignment mark is provided with dummy damascene structures, assuring equal polishing rates for active damascene structures and the surface, region of the layer of dielectric overlying an alignment mark. This removes the potential for the accumulation of copper on the surface of the layer of dielectric overlying of the alignment mark.

BRIEF DESCRIPTION OF THE DRAWINGS

FIG. 1 shows a prior art surface of a layer of dielectric overlying an alignment mark.

FIG. 2 shows a cross section of the layer of dielectric of FIG. 1, a layer of copper has been deposited over the surface of the layer of dielectric.

DESCRIPTION OF THE PREFERRED EMBODIMENTS

Figure 3:
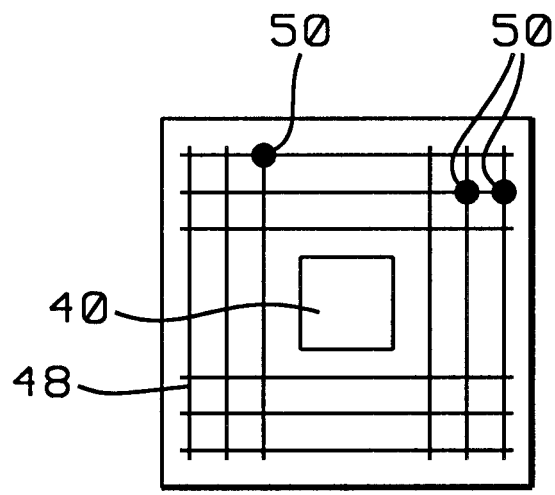
FIG. 3 shows a surface of a layer of dielectric of the invention overlying an alignment mark, a dummy copper pattern has been provided on the surface of the layer of dielectric.

The conventional processing-sequence that is used to create a copper pad typically starts with a semiconductor surface, typically the surface of a silicon single crystalline substrate, in which a copper electrical contact point has been provided. This contact point can be a point of interconnect with a network of metal lines or it can be a contact point or a point to which a via needs to be established. The point of interconnect can also be an alignment mark that is typically used to position wafers inside semiconductor processing tools. A passivation layer is deposited over the surface, an opening overlying the contact point is created in the passivation layer. The copper from which the copper pad is created is next deposited. The copper layer is patterned and etched, leaving the layer of copper in place above the contact point.

The deposition of the layer of copper that is used for the creation of a copper damascene structure or a copper contact pad uses Electro Chemical Plating (ECP) technology. Typically, the surface of the layer of dielectric that overlies the copper alignment mark is surrounded by a blanket surface area that does not contain any additional elements (such as damascene structures). The deposition rate of copper, using ECP technology, is dependent on the density of the features that are present in or on the surface over which the layer of copper is deposited. This as follows: the copper deposition rate is higher in the blanket surface area than in a surface area that contains semiconductor elements (in or on the surface thereof) such as damascene structures. This difference in deposition rate follows from the fact that a significant percentage of the deposited copper is used to create ("fill up") the damascene structures over which the copper is deposited. On a blanket surface area there are, by definition, no damascene structures, reason as to why the copper tends to accumulate over the blanket surface area. Since, after deposition of the layer of copper, the surface of the deposited layer of copper must be polished, the polishing of the copper layer is dependent on the density of the semiconductor elements, such as damascene structures, that are present on the semiconductor surface. With a thicker layer having been deposited over the (blanket) surface area of the dielectric overlying the alignment mark, the polishing rate of the copper overlying the alignment mark is lower (there is more copper to be removed, therefor the removal rate is lower) than the polishing rate of the damascene structures that are also created in the surface of the layer of dielectric. From this it is apparent that copper residue is more likely to remain present in the surface area of the layer of dielectric overlying the alignment mark. This excess of copper residue leads to two concerns:

- the copper residue affects photolithography accuracy since the light that is used by the photolithography process will be dispersed and reflected by the copper residue, and
- the copper residue forms a source of shorts between device features.

The phenomenon of having a higher rate of copper deposition in the blanket area of the surface of the layer of dielectric overlying the alignment mark is attributed to the presence of a higher (denser) electromagnetic field in the vicinity of the alignment mark as compared with the surface area in which damascene structures are being created. The copper that fills the damascene structure absorbs electromagnetic energy of the electric field, making this field relatively weak when compared with the strength of the electromagnetic in the blanket surface area that, in prior art application, overlies the alignment mark.

The difference in copper removal rate, using CMP processing, between the copper deposited over a blanket surface region of the layer of dielectric overlying the alignment mark and the copper deposited over the surface of the layer of dielectric in which damascene structure are created is attributed to the fact that the layer of copper that overlies the alignment mark is thicker, therefore more copper needs to be removed from the surface of the copper that surrounds the alignment mark (as compared with the surface of the copper in the regions where damascene structures are created). This thicker copper results in a lower copper removal rate over the blanket surface area.

From al of the above, it is clear that copper residue is more likely to remain in the blanket surface area that surrounds the alignment mark of prior art applications.

FIG. 1 shows a top view of a conventional alignment mark and its surrounding surface region. Specifically shown in FIG. 1 are:

- 40, the conventional alignment mark
- 42, the blanket surface area of the layer of dielectric overlying a convention alignment mark.

FIG. 2 shows a cross section of a conventional layer of copper deposited over the surface of a layer of dielectric, damascene structures (not shown) are being created in the surface of the layer of dielectric. Specifically shown in FIG. 2 are:

- 40, a conventional alignment mark
- 44, a layer of dielectric deposited over the surface of the alignment mark, this layer of dielectric is the dielectric in which damascene structures (not shown) are created
- 46, a layer of copper that is used to create ("fill") the damascene structures being created in the surface of layer 44 of dielectric
- 41, the height of the layer 44 of dielectric
- 43, the height of the layer 46 of copper.

Figure 4:
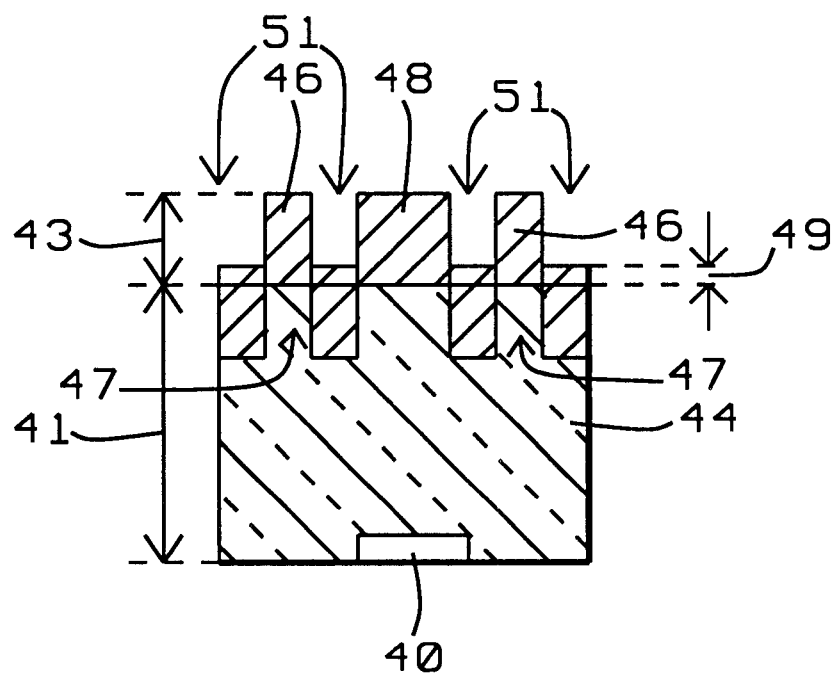
FIG. 4 shows a cross section of the layer of dielectric of FIG. 3 including a cross section of the dummy copper pattern that has been provided on the surface of the layer of dielectric.

The invention is shown in FIGS. 3 and 4, where in FIG. 3 is shown:

- 40, an alignment mark
- 48, an array of intersecting lines at the intersections 50 of which copper (columns) are provided; this latter statement will be more clear by the cross section that is shown in FIG. 4.

Specifically shown in FIG. 4 are:

- 40, an alignment mark
- 44, a layer of dielectric deposited over th e surface of the alignment mark 40, this layer if dielectric is the dielectric in which damascene structures (not shown) are created
- 46, the patterned and etched layer of copper of the invention, this layer if further used to create ("fill") the damascene structures that are created in the surface of layer 44 of dielectric
- 41, the height of the layer 44 of dielectric, and
- 43, the height of the layer 46 of copper.

It must be noted that the value of heights 41 and 43 remains the same between the prior art method (FIGS. 1, 2) and the method of the invention (FIGS. 3, 4). What has however been provided in the cross sections that are shown in FIGS. 3 and 4 is that the layer 46 of copper has been patterned and etched. Before the layer 46 of copper is deposited and as part of the processing that is performed for the creation of the damascene structures in the die area of the substrate (not shown), the layer 44 of dielectric is etched creating trenches 47 in the surface of layer 44. Copper layer 46 is then deposited, this layer 46 is patterned and etched creating the previously referred to "columns" of copper at the points of intersect of lines 50, FIG. 3. Further noteworthy in the cross section that is shown in FIG. 4 are:

- copper of layer 46 remains in place over a height 49 overlying layer 44 of dielectric
- the elements that have been highlighted as 46 are the copper columns that are created at the intersects of lines 50, FIG. 3, and
- a layer 48 of copper is left in place overlying the alignment mark 40.

The patterning and etching of layer 46 of copper is a separate processing step since, at the time of the etching of this layer 46 for the copper pattern 46/48 overlying the alignment mark 40, the damascene structures have been formed (in the layer 44 of dielectric) and (merely) need to be filled with copper. The sequence of processing is therefore as follows:

1) depositing layer 44 of dielectric over a semiconductor surface, preferably the surface of a semiconductor substrate
2) patterning and etching layer 44 of dielectric, simultaneously creating damascene openings in this layer 44 of dielectric (in the die area of the wafer) and creating trenches 47 in the region of and overlying the alignment mark 40
3) depositing the layer 46 of copper, filling the damascene structures and trenches 47, the layer of copper is overlying the surface of layer 44 of dielectric
4) patterning and etching the layer 46 of copper, creating openings 51 in the layer 46 of copper where the layer 46 of copper overlies the alignment mark 40, and
5) polishing the surface of layer 46 using methods of CMP down to the surface of layer 44 of dielectric.

The following design considerations can be applied to the creation of the dummy copper pattern on the surface of the layer of dielectric:

- the trenches that are created in the layer of dielectric can be referred to as a pattern of first trenches, the trenches that are created in the surface of the layer of copper can be referred to as second trenches
- the depth of the second trenches created in said layer of copper is less than said height of said layer of copper by a measurable amount
- the layer of dielectric typically comprises silicon dioxide
- the second trenches created in the layer of copper can have a width that is between about 1,000 and about 8,000 Angstrom
- the second trenches created in the layer of copper can have a length that is between about 3 and about 10 $\mu$m
- the second trenches created in the layer of copper can have a depth that is between about 3000 Angstrom and about 30,000 Angstrom
- the layer of dielectric can be deposited to a thickness between about 5,000 and 30,000 Angstrom.

The essential point of the present invention can be stated as follows: a dummy copper pattern overlying the alignment mark is provided over the surface of a layer of dielectric, copper damascene structures are created in the surface of the layer of dielectric.

The advantages that are provided by the present invention can be summarized as follows:

- the thickness of the copper that is deposited overlying the alignment mark, using methods of ECP, is reduced
- the rate of removal (of the dummy pattern) of the copper overlying the alignment mark is increased
- the copper can readily be removed from the surface of the layer of dielectric overlying the alignment mark
- the method of the invention is not prone to creating copper residue in the surface region of the layer of dielectric overlying the alignment mark, and
- a source of device defect is eliminated.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method to eliminate copper residue from surface regions of a layer of dielectric that overly an alignment mark, damascene structures being created in the surface of the layer of dielectric, providing the steps of:

providing a substrate, an alignment mark having been provided in or on the surface of said substrate, said substrate having been provided with die areas for creation of semiconductor devices;

depositing a layer of dielectric over the surface of said substrate, including the surface of said alignment mark provided in or on the surface of said substrate, including the surface of said die areas;

creating a pattern of damascene structures in the surface of said layer of dielectric overlying the die areas, further creating a pattern of first trenches in the surface of said layer of dielectric overlying said alignment mark;

depositing a layer of copper having a height over the surface of said layer of dielectric, including said pattern of damascene structures and said pattern of first trenches overlying said alignment mark;

creating a pattern of second trenches in said layer of copper, said second trenches being aligned with said alignment mark, said second trenches intersecting under an angle of about ninety degrees; and polishing the surface of said layer of copper down to the surface of said layer of dielectric, using methods of Chemical Mechanical Polishing (CMP).

2. The method of claim 1 wherein said depth of said second trenches created in said layer of copper is less than said height of said layer of copper by a measurable amount.

3. The method of claim 1 wherein said second trenches created in said layer of copper provides for second trenches overlying an immediate vicinity of said alignment mark, leaving in place a layer of copper overlying said alignment mark.

4. The method of claim 1 wherein said depositing a layer of copper applies Electro Chemical Plating technology.

5. The method of claim 1 wherein said layer of dielectric comprises silicon dioxide.

6. The method of claim 1 wherein said second trenches created in said layer of copper have a width that is between about 1,000 and about 8,000 Angstrom.

7. The method of claim 1 wherein said second trenches created in said layer of copper have a length that is between about 3 and about 10 $\mu$m.

8. The method of claim 1 wherein said second trenches created in said layer of copper have a depth that is between about 3000 Angstrom and about 30,000 Angstrom.

9. The method of claim 1 wherein said layer of dielectric is deposited to a thickness between about 5,000 and 30,000 Angstrom.

10. A method to eliminate copper residue from surface regions of a layer of dielectric that overly an alignment mark, damascene structures being created in the surface of the layer of dielectric, providing the steps of:

provide a substrate, an alignment mark having been provided in or on the surface of said substrate, said substrate having been provided with die areas for creation of semiconductor devices;

depositing a layer of dielectric over the surface of said substrate, including the surface of said alignment mark provided in or on the surface of said substrate, including the surface of said die areas;

creating a pattern of damascene structures in the surface of said layer of dielectric overlying the die areas, further creating a pattern of first trenches in the surface of said layer of dielectric overlying said alignment mark;

depositing a layer of copper having a height over the surface of said layer of dielectric, including said pattern of damascene structures and said pattern of first trenches overlying said alignment mark;

creating a pattern of second trenches in said layer of copper, said second trenches being aligned with said alignment mark, said second trenches intersecting under an angle that differs from a ninety degree angle by a measurable amount; and polishing the surface of said layer of copper down to the surface of said layer of dielectric, using methods of Chemical Mechanical Polishing (CMP).

11. The method of claim 10 wherein said depth of said second trenches created in said layer of copper is less than said height of said layer of copper by a measurable amount.

12. The method of claim 10 wherein said second trenches created in said layer of copper provides for second trenches overlying an immediate vicinity of said alignment mark, leaving in place a layer of copper overlying said alignment mark.

13. The method of claim 10 wherein said depositing a layer of copper applies Electro Chemical Plating technology.

14. The method of claim 10 wherein said layer of dielectric comprises silicon dioxide.

15. The method of claim 10 wherein said second trenches created in said layer of copper have a width that is between about 1,000 and about 8,000 Angstrom.

16. The method of claim 10 wherein said second trenches created in said layer of copper have a length that is between about 3 and about 10 $\mu$m.

17. The method of claim 10 wherein said second trenches created in said layer of copper have a depth that is between about 3000 Angstrom and about 30,000 Angstrom.

18. The method of claim 10 wherein said layer of dielectric is deposited to a thickness between about 5,000 and 30,000 Angstrom.

* * * * *